United States Patent
Wu et al.

(10) Patent No.: US 9,356,051 B2
(45) Date of Patent: May 31, 2016

(54) PIXEL ARRAY

(71) Applicant: E Ink Holdings Inc., Hsinchu (TW)

(72) Inventors: Chi-Ming Wu, Hsinchu (TW); Shu-Ping Yan, Hsinchu (TW); Yi-Lung Wen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/488,305

(22) Filed: Sep. 17, 2014

(65) Prior Publication Data

US 2015/0214246 A1      Jul. 30, 2015

(30) Foreign Application Priority Data

Jan. 28, 2014   (TW) .............................. 103103258 A

(51) Int. Cl.
   *H01L 27/00*      (2006.01)
   *H01L 27/12*      (2006.01)
(52) U.S. Cl.
   CPC .................................... *H01L 27/124* (2013.01)
(58) Field of Classification Search
   CPC ................ H01L 27/124; G02F 1/1345; G02F 1/136286

See application file for complete search history.

(56) References Cited

U.S. PATENT DOCUMENTS

2010/0066967 A1*   3/2010  Takahashi ......... G02F 1/136286
                                                                349/143

* cited by examiner

*Primary Examiner* — Whitney T Moore
*Assistant Examiner* — Joseph Galvin, III
(74) *Attorney, Agent, or Firm* — Jianq Chyun IP Office

(57) ABSTRACT

A pixel array includes a plurality of first and second signal lines, a plurality of active devices, a plurality of pixel electrodes, a plurality of selection lines, and a plurality of protrusions. The second signal lines are electrically insulated to and intersected with the first signal lines. Each active device is electrically connected to one of the first signal lines and one of the second signal lines, respectively. The pixel electrodes are electrically connected to the active devices. The selection lines are electrically insulated to the second signal lines and intersected with the first signal lines so as to form a plurality of intersections including a plurality of first and second intersections. The selection lines are electrically connected to the first signal lines at the first intersections. The protrusions are disposed between the selection lines and the first signal lines, and located at the second intersections.

11 Claims, 8 Drawing Sheets

PIXEL ARRAY

CROSS-REFERENCE TO RELATED APPLICATION

This application claims the priority benefit of Taiwan application serial no. 103103258, filed on Jan. 28, 2014. The entirety of the above-mentioned patent application is hereby incorporated by reference herein and made a part of this specification.

FIELD OF THE INVENTION

The invention relates to a pixel array; more particularly, the invention relates to a pixel array suitable for a slim border design.

DESCRIPTION OF RELATED ART

In recent years, with the progress in technology industry, electronic devices such as mobile phones, tablet computers or eBooks have been extensively used in daily life. These electronic devices are more and more popular, and are developed and designed toward convenience and multifunction. When consumers purchase these electronic devices, a display device having a slim border has become a major selection factor in addition to software and hardware functions.

In general, in order to cope with developing designs of a screen for lightweight and a maximum display area, a non-display area configured for shielding connection circuits at a periphery of the screen is reduced to enlarge the display area of the screen, such that a display device meets the design requirement of slim border. As shown in FIG. 1, in order for transmitting driving signals and displaying information, a display device is provided with first signal lines 10 and second signal lines 20 intersected with each other. In recent years, a design for sliming a border line has been developed, in which selection lines 30 are arranged in addition to the first signal lines 10 and the second signal lines 20, such that the selection lines 30 are electrically connected to the corresponding first signal lines 10 at bridge points X. Accordingly, a chip 40 may transmit driving signals to the corresponding first signal lines 10 through the selection lines 30, so as to drive corresponding active devices 50. Since such layout design may wire the first signal lines 10 and the second signal lines 20 from the same side of a display area A to the chip 40, widths W of a non-display area on other sides may be narrowed so as to fulfill the design of slim border.

In all of intersections of the selection lines 30 and the first signal lines 10, the bridge points X are provided with interconnection structures where the selection lines 30 are electrically connected to the corresponding first signal lines 10, such that structures of the bridge points X are different from those of other intersections. Consequently, in a process of performing an optical detection, many dummy defects caused by the structures of the bridge points X may be detected. In other words, the structure of the bridge points are prone to interfere with the optical detection, and performance on detecting defects may be affected.

SUMMARY OF THE INVENTION

The invention provides a pixel array, which may minimize interferences caused by patterns of bridge points during optical detections.

A pixel array of the invention includes a plurality of first signal lines, a plurality of second signal lines, a plurality of active devices, a plurality of pixel electrodes, a plurality of selection lines, and a plurality of protrusions. The second signal lines are electrically insulated to the first signal lines and intersected with the first signal lines. Each active device is electrically connected to one of the first signal lines and one of the second signal lines, respectively. The pixel electrodes are electrically connected to the active devices. The selection lines are electrically insulated to the second signal lines and intersected with the first signal lines so as to form a plurality of intersections. The intersections include a plurality of first intersections and a plurality of second intersections. The selection lines are electrically connected to the first signal lines at the first intersections. The protrusions are disposed between the selection lines and the first signal lines, and located at the second intersections.

In an embodiment of the invention, the pixel array further includes an insulation layer. The insulation layer is at least located between the first signal line and the selection line, and the protrusion is located between the insulation layer and the selection line, wherein the insulation layer has a plurality of openings corresponding to the first intersection, and a first selection line is in contact with the first signal line through the opening.

In an embodiment of the invention, a profile of an orthogonal projection of each of the protrusion on the first signal line is identical to a profile of an orthogonal projection of each of the openings on the first signal line.

In an embodiment of the invention, each of the active devices includes a gate, a channel layer, a source and a drain. The channel layer and the gate are opposite to each other up and down, and the insulation layer is located between the channel layer and the gate. The source and the drain are located at two opposite sides of the channel layer, respectively.

In an embodiment of the invention, the protrusion and the channel layer of the active device are located at the same layer.

In an embodiment of the invention, each of the selection lines crosses multiple of the protrusions, and heights of the selection line at the second intersection are higher than heights of the selection lines at other locations.

In an embodiment of the invention, each of the first signal lines crosses multiple of the protrusions, and heights of the first signal line at the second intersection are higher than heights of the signal lines at other locations.

In an embodiment of the invention, a material of the protrusion is different from a material of the insulation layer.

In an embodiment of the invention, numbers of the protrusions are equal to numbers of the second intersections, and each of the protrusions is located at one of the second intersections.

In an embodiment of the invention, the protrusions have the same shape and size.

In an embodiment of the invention, each of the protrusions is an island-shaped protrusion.

In an embodiment of the invention, the protrusion is not in direct contact with the first signal line.

In an embodiment of the invention, each of the selection lines is in direct contact with one of the first signal lines.

In an embodiment of the invention, each of the selection lines is electrically connected with only one of the first signal lines.

In light of the foregoing, the pixel array of the invention is provided with protrusions at intersections (the second intersections) other than bridge points (the first intersections), such that patterns detected at the first intersections and the second intersections are substantially the same, so as to minimize interferences caused by dummy defects generated by patterns of the bridge points.

To make the aforesaid features and advantages of the invention more comprehensible, several embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
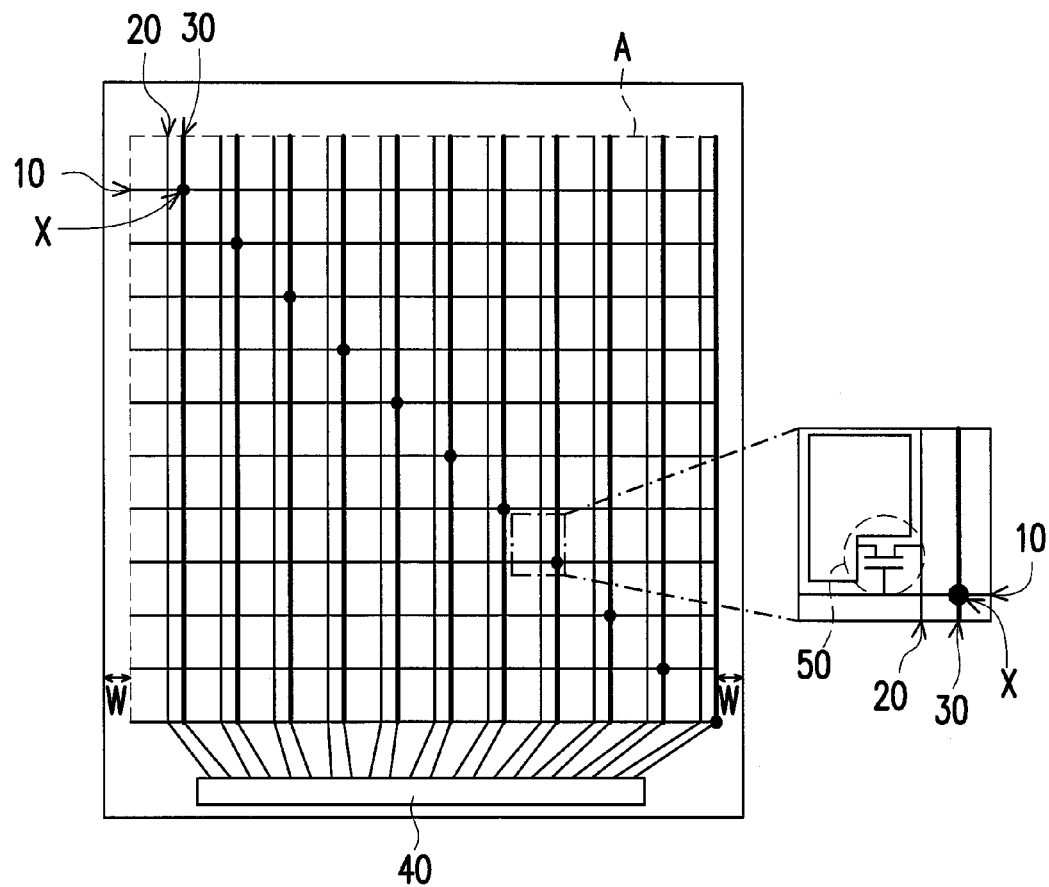
FIG. 1 is a schematic top view of a conventional pixel array.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
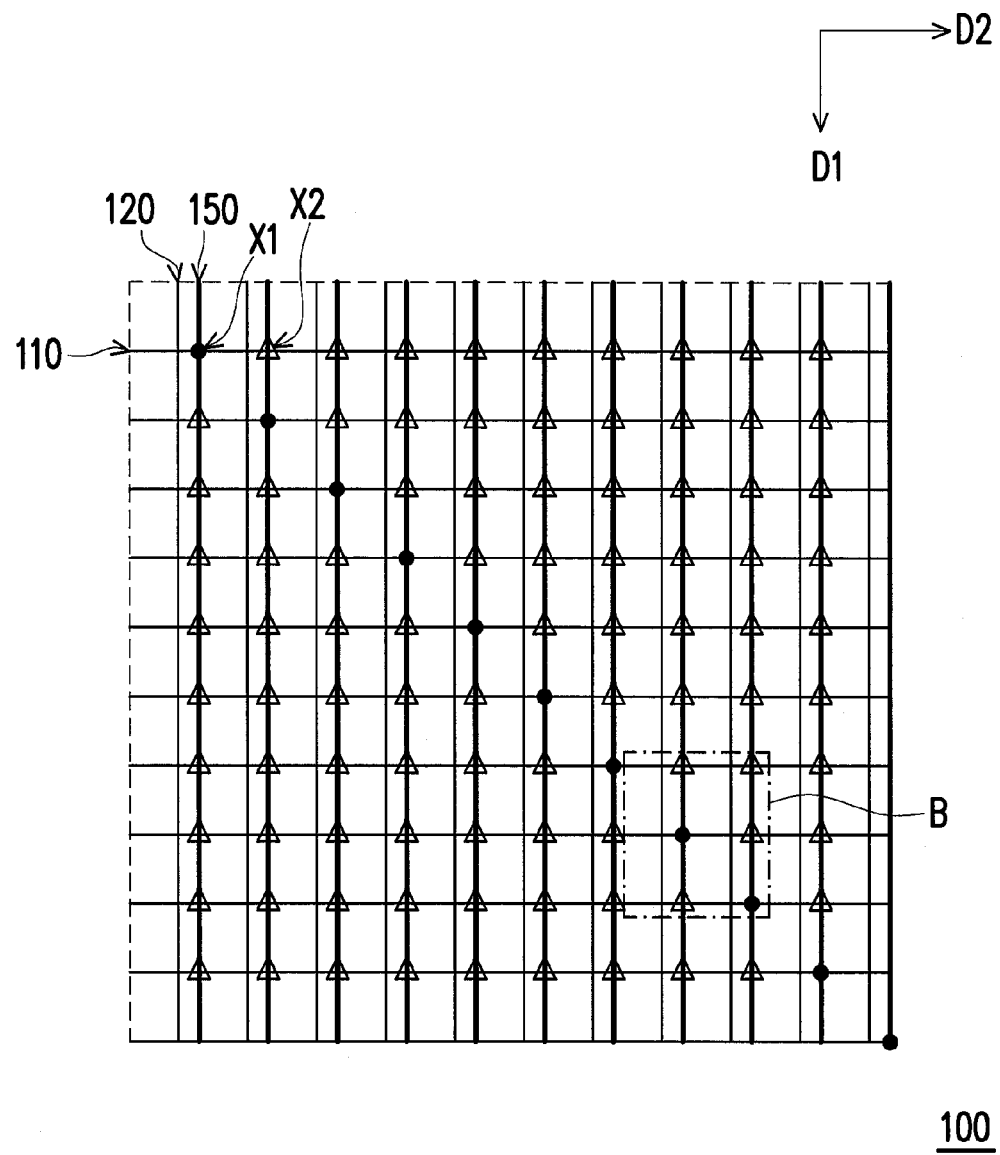
FIG. 2A is a schematic top view illustrating a pixel array according to an embodiment of the invention.
Figure 2B:
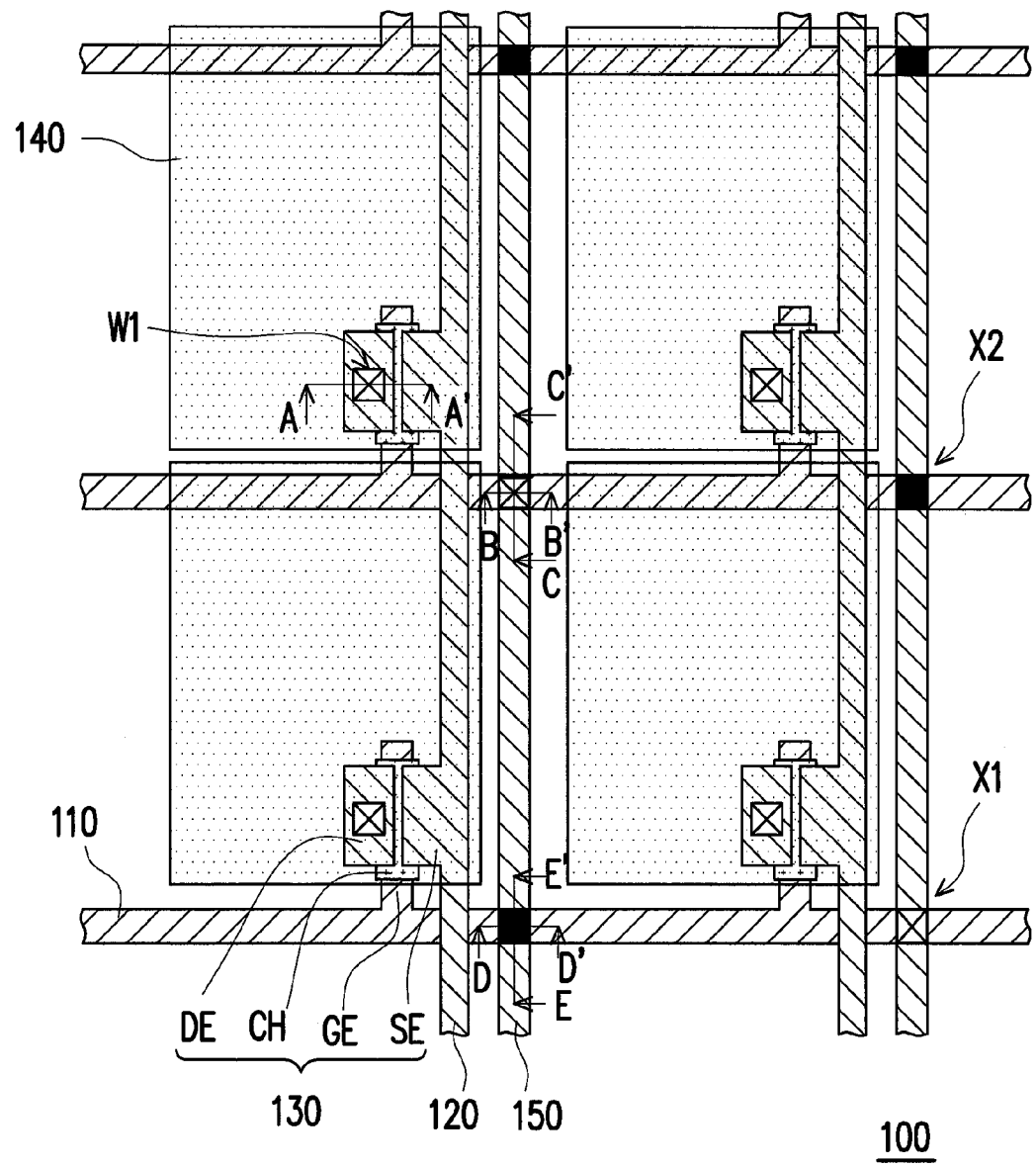
FIG. 2B is a partial enlarged view of a pixel array in an area B of FIG. 2A.
Figure 2C:
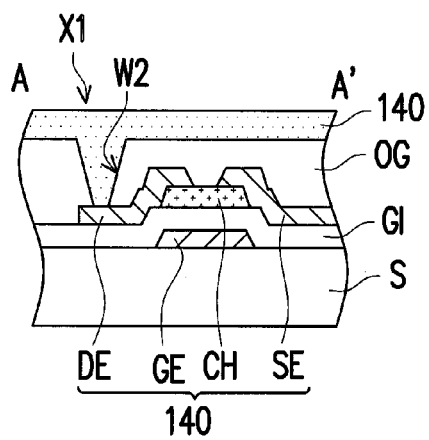
FIG. 2C is a cross-sectional view taken along lines A-A', B-B', C-C', D-D' and E-E' of FIG. 2B.
Figure 2C:
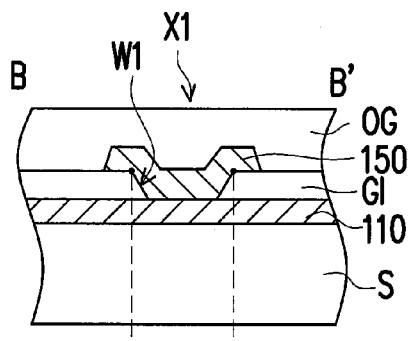
Figure 2C:
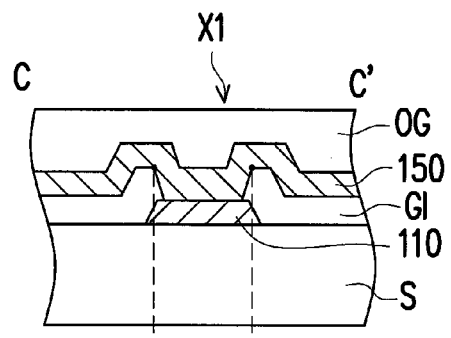
Figure 2C:
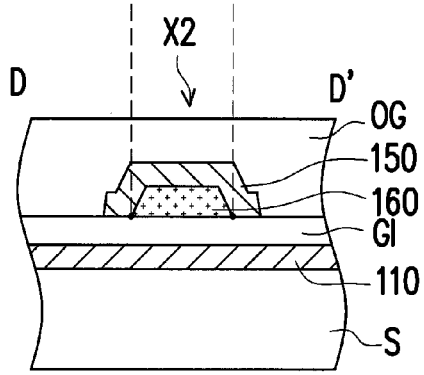
Figure 2C:
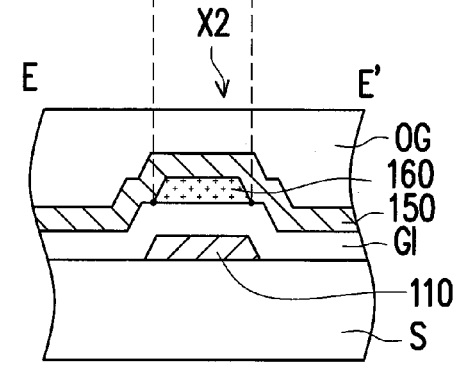

FIG. 2A is a schematic top view illustrating a pixel array according to an embodiment of the invention. FIG. 2B is a partial enlarged view of a pixel array in an area B of FIG. 2A. FIG. 2C is a cross-sectional view along lines A-A', B-B', C-C', D-D' and E-E' of FIG. 2B. With reference to FIG. 2A to FIG. 2C, a pixel array 100, for example, is disposed on a substrate S, and the pixel array 100 includes a plurality of first signal lines 110, a plurality of second signal lines 120, a plurality of active devices 130, a plurality of pixel electrodes 140, a plurality of selection lines 150 and a plurality of protrusions 160.

The second signal lines 120 are electrically insulated to the first signal lines 110 and are intersected with the first signal lines 110. In particular, the first signal lines 110 of the present embodiment are arranged along a first direction D1, and extend along a second direction D2, respectively. On the other hand, the second signal lines 120 are arranged along the second direction D2, and extend along the first direction D1, respectively. The first direction D1 intersects with the second direction D2, and the first direction D1, for example, is perpendicular to the second direction D2, but the invention is not limited herein.

In the present embodiment, each of the active devices 130 is electrically connected to one of the first signal lines 110 and one of the second signal lines 120, respectively. One of the first signal lines 110 and the second signal lines 120 is deemed as scan lines, while the other one is deemed as data lines. Types of signals practically transmitted by both are based on components to which the signal lines and the active devices 130 connect.

Specifically, the active devices 130, for example, includes a gate GE, a channel layer CH, a source SE and a drain DE. The gate GE is disposed on the substrate S, but is not limited to be in direct contact with the substrate S. The channel layer CH and the gate GE located on upper and lower sides are opposite to each other. The source SE and the drain DE are located at two opposite sides of the channel layer CH.

According to the embodiment, the first signal line 110 is electrically connected to the gate GE, while the second signal line 120 is electrically connected to the source SE. Thus, the first signal line 110 is deemed as the scan line, while the second signal line 120 is deemed as the data line. According to another embodiment, when the first signal line 110 is electrically connected to the source SE while the second signal line 120 is electrically connected to the gate GE, the first signal line 110 is deemed as the data line while the second signal line 120 is deemed as the scan line.

The first signal lines 110 and the gates GE of the present embodiment, for example, may be formed by patterning a first metal layer, while the second signal lines 120, the sources SE and the drain DE, for example, may be formed by patterning a second metal layer. The first and second metal layers are merely adapted for distinguishing film layers formed in different manufacturing processes, and are not adapted for defining a sequence of forming both. In actual manufacturing processes, the first metal layer may be manufactured before or after the second metal layer is manufactured.

In the present embodiment, each of the active devices 130, for example, is a bottom gate thin film transistor. Namely, the first signal line 110 and the gate GE are manufactured before the second signal line 120, the source SE and the drain DE are manufactured, and the gate GE, the channel layer CH and the source SE (and the drain DE) are stacked sequentially on the substrate S, such that the channel layer CH is disposed on the gate GE, while the source SE and the drain DE are located on the channel layer CH. However, types or lamination structures of the active devices 130 are not limited in the invention.

The pixel array 100 may further include an insulation layer GI, and the insulation layer GI has a plurality of openings W1. In the present embodiment, the opening W1 exposes a partial area of the first signal line 110. In addition, the insulation layer GI is located on the gate GE, the first signal line 110 and the substrate S, and between the gate GE and the channel layer CH. Furthermore, the source SE and the drain DE extend onto the insulation layer GI from the channel layer CH, respectively.

The pixel array 100 may further include a flat layer OG. The flat layer OG is located on the active device 130 and has a plurality of openings W2. The pixel electrode 140 is disposed on the flat layer OG and is electrically connected to the active device 130 through the opening W2. Specifically, the pixel electrode 140 is in contact with the drain DE of the active device 130 through the opening W2. In the present embodiment, each of the pixel electrodes 140 is disposed correspond to one of the active devices 130, but the invention is not limited to an amount ratio of the pixel electrode 140 and the active device 130.

The selection lines 150 are electrically insulated to the second signal lines 120 and are intersected with the first signal lines 110 so as to form a plurality of intersections. Specifically, the selection lines 150 are arranged along the second direction D2, and extend along the first direction D1, respectively. In addition, the selection lines 150 and the second signal lines 120 of the present embodiment are alternatively arranged along the second direction D2, but the invention is not limited herein.

The selection lines 150 are primarily configured for transmitting signals from chip ends to the corresponding first signal lines 110, such that the first signal lines 110 and the second signal lines 120 of the pixel array 100 may be wired to the chip ends from the same side to be connected with chips (not shown). Therefore, a width of the non-display area is narrowed, such that the display device having the pixel array 100 of the present embodiment meets the design requirement of slim border. Consequently, each selection line 150 is electrically connected to only one of the first signal lines 110.

Since the selection lines 150 intersect with the first signal lines 110, a dielectric layer is required to be arranged between the selection lines 150 and the first signal lines 110, so as to prevent short circuits from occurring at the intersections of the selection lines 150 and the first signal lines 110, and causing malfunctions. The selection lines 150 and the first signal lines 110 of the present embodiment are located at different layers, and the selection lines 150, for example, is located at the same layer as the second signal lines 120. In details, the selection lines 150, the second signal lines 120, the sources SE and the drains DE, for examples, are formed by patterning the second metal layer, such that the insulation layer GI is located between the first signal line 110 and the selection line 150, and the selection line 150 is in contact with the first signal line 110 through the opening W1. In addition, the flat layer OG further covers the selection line 150.

The intersections of the selection lines 150 and the first signal lines 110 include a plurality of first intersections X1 and a plurality of second intersections X2. The selection lines 150 are electrically connected to the first signal lines 110 at the first intersections X1. Namely, the selection lines 150 are conducted to the first signal lines 110 at the first intersections X1. In other words, the first intersections X1 are arranged corresponding to the openings W1.

The protrusions 160 are disposed between the selection lines 150 and the first signal lines 110, and located at the second intersections X2. In other words, the protrusions 160 are disposed at the intersections other than locations (openings W1) where the selection lines 150 are conducted to the first signal lines 110. Namely, the selection lines 150 are not conducted to the first signal lines 110 at the second intersections X2.

The optical detection is mainly used for detecting grayscale varieties obtained after light is reflected by reflective elements (namely, an upper layer metal located at the intersections, such as the selection lines 150 or the first signal lines 110), and the grayscale varieties are used as a comparison basis. The selection line 150 located at sidewalls of the insulation layer GI is prone to reflect light. Thus, a bright spot is detected at the first intersection X1 when performing the optical detection. In order to minimize interferences caused by the selection lines 150 at the first intersections X1 during the optical detections, the protrusions 160 of the present embodiment are arranged at the second intersections X2, such that the upper layer metals (such as the selection lines 150) cross the protrusions 160 located at the second intersections X2. Bright spots are detected at the second intersections X2 when light is reflected by the selection lines 150 located at sidewalls of the protrusions 160. In addition, by adjusting shapes of the protrusions 160, patterns of the bright spots detected at the first intersections X1 and the second intersections X2 are substantially the same. Accordingly, during optical detections, interferences caused by dummy defects may be eliminated and pixels having actual defects may be screening out.

In the present embodiment, the profile of the orthogonal projection of each of the protrusions 160 on the first signal lines 110, for example, is identical to the profile of the orthogonal projection of each of the openings W1 on the first signal lines 110. Furthermore, the protrusions 160, for example, have the same shape and size. Moreover, numbers of the protrusions 160 are equal to numbers of the second intersections X2, and each of the protrusions 160 is located at one of the second intersections X2. In other words, each of the second intersections X2 is provided with one of the protrusions 160.

The protrusions 160 of the present embodiment are not referred to protrusion sites of the insulation layers GI. Specifically, the protrusions 160 are not formed at the same time as the insulation layers GI are formed, and are components independent from the insulation layers GI. For example, the protrusions 160 are island-shaped protrusions located at a side of the insulation layers GI far away from the first signal lines 110, and the protrusions 160 are not in direct contact with the first signal lines 110. With a structure of manufacturing the first signal lines 110 prior to the selection lines 150, each of the selection lines 150 crosses multiple protrusions 160, and heights of the selection lines 150 at the second intersections X2 are higher than heights of the selection lines 150 at other locations.

In the present embodiment, the protrusions 160 and the channel layers CH of the active devices 130, for example, are located at the same layer. Namely, the protrusions 160 are located between the insulation layers GI and the selection lines 150. In addition, a material of the protrusions 160, for example, adopts a material of the channel layers CH. Namely, the material of the protrusions 160 is different from a material of the insulation layers, and the protrusions 160 and the channel layers CH may be formed by patterning at the same time. Accordingly, adding another process for manufacturing the protrusions is not required. In other words, the pixel array 100 of the present embodiment may complete manufacturing the protrusions 160 within numbers of the conventional process.

Figure 3A:
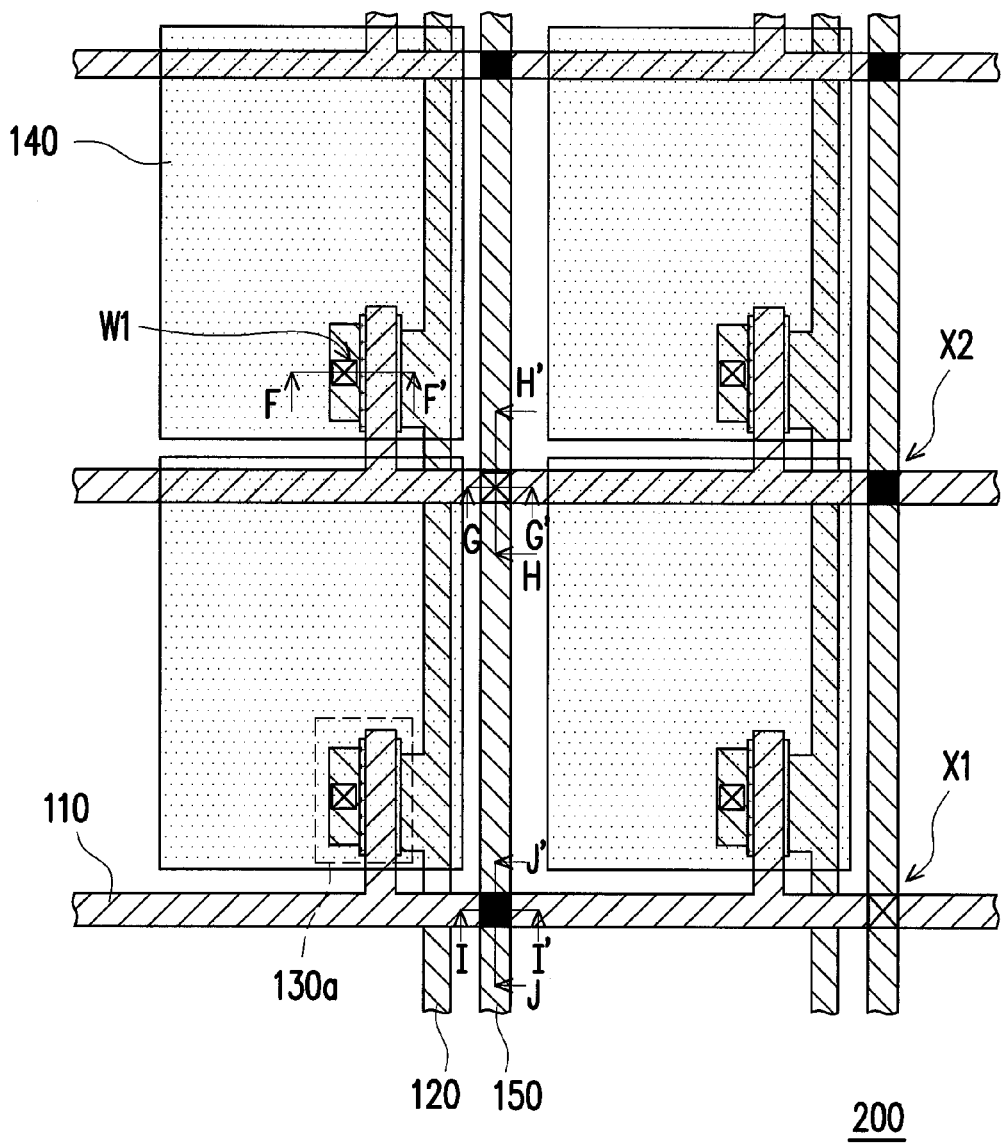
FIG. 3A is an enlarged view of another pixel array in an area B of FIG. 2A.
Figure 3B:
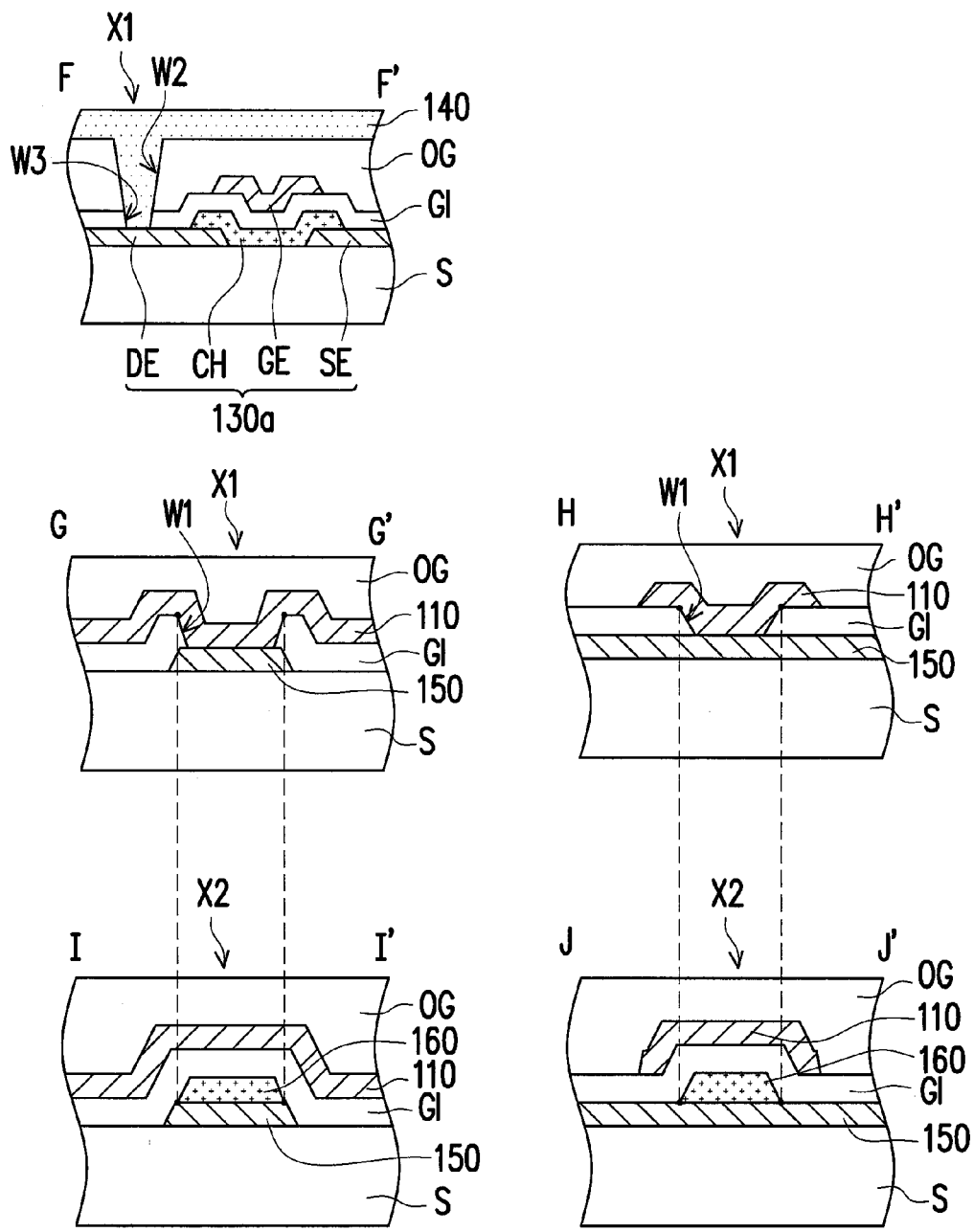
FIG. 3B is a cross-sectional view taken along lines F-F', G-G', H-H', I-I' and J-J' of FIG. 3A.

In FIG. 2B and FIG. 2C, an implementation type of the pixel array 100 is to manufacture the first signal lines 110 before manufacturing the second signal lines 120 and the selection line s 150, and the active devices 130 adopt a structure of the bottom gate thin film transistor, but the invention is not limited herein. FIG. 3A is an enlarged view of another pixel array in an area B of FIG. 2A. FIG. 3B is a cross-sectional view taken along lines F-F', G-G', H-H', I-I' and J-J' of FIG. 3A. With reference to FIG. 3A and FIG. 3B, the pixel array 200 of the present embodiment is substantially the same as the pixel array 100 of FIG. 2B and FIG. 2C, and the same components are represented by the same reference numbers. Thus, corresponding contents thereof are not reiterated hereinafter.

The primary difference lies in that the first signal lines 110 of the present embodiment are manufactured after the second signal lines 120 and the selection lines 150 are manufactured, and the active devices 130a adopt a structure of a top gate thin film transistor. In particular, the second signal lines 120 (and the selection lines 150, the sources SE, the drains DE), the channel layers CH (and the protrusions 160), the insulation layers GI, the gate GE (and the first signal lines 110) are sequentially disposed on the substrate S. Furthermore, the insulation layer GI further has an opening W3, wherein the opening W2 and the opening W3 are connected to each other, and the pixel electrode 140 is in contact with the drain DE through the opening W2 and the opening W3. Besides, the upper layer metal of the second intersection X2 is the first signal line 110, wherein the opening W1 of the insulation layer GI exposes a partial area of the selection line 150, and the first signal line 110 is in contact with the corresponding selection line 150 through the opening W1. Moreover, each of the first signal lines 110 crosses multiple of the protrusions 160, and heights of the first signal lines 110 at the second intersections X2 are higher than heights of the first signal lines 110 at other locations.

Figure 4:
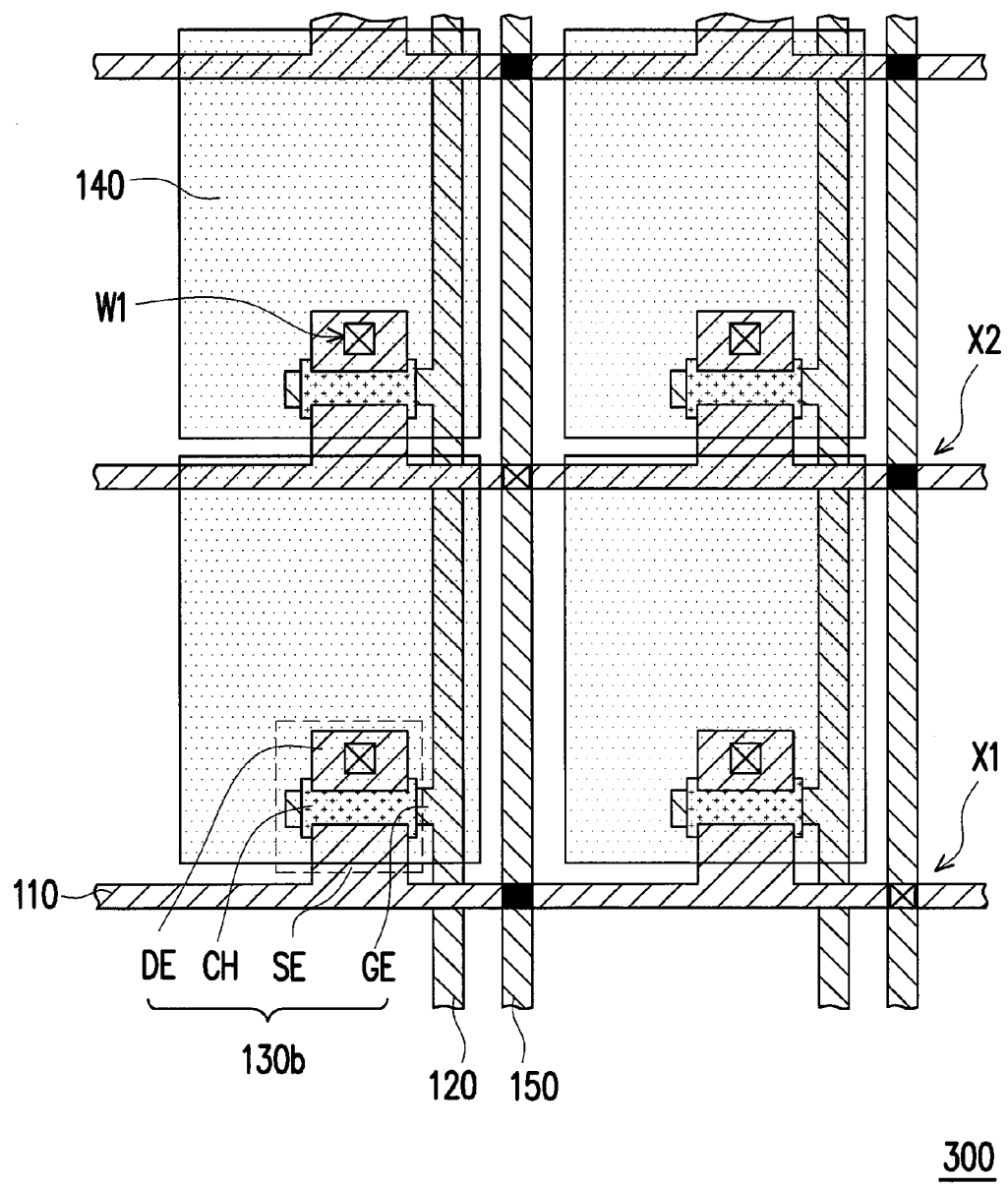
FIG. 4 and FIG. 5 are partial enlarged views of other types of the pixel array in the area B of FIG. 2A.
Figure 5:
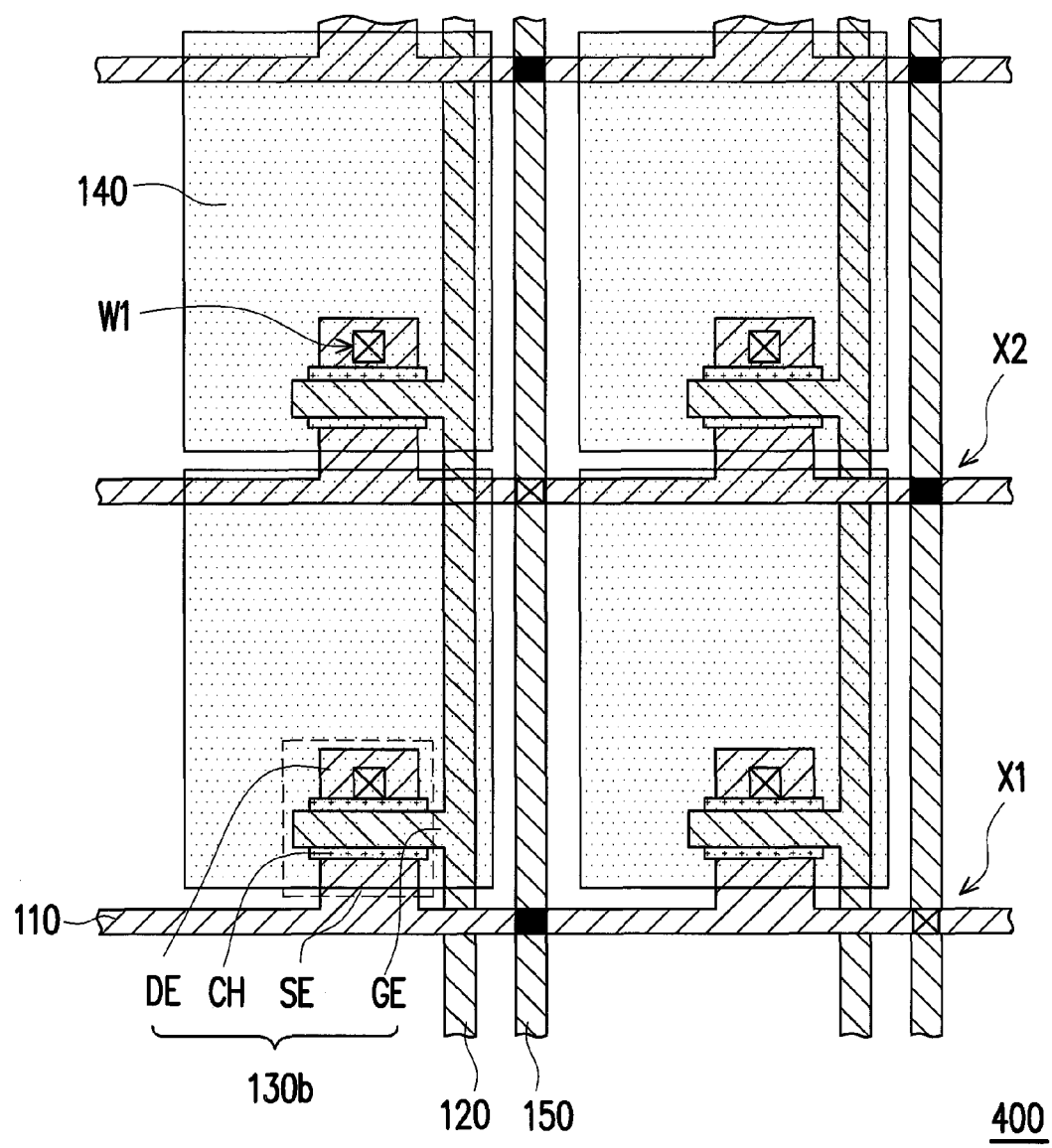

With structures of the pixel arrays 100 and 200, the first signal lines 110 are electrically connected to the gates GE for transmitting scan signals, and the second signal lines 120 are electrically connected to the sources SE for transmitting data signals, but the invention is not limited herein. The following is an implementation type illustrating the first signal lines 110 configured for transmitting the data signals and the second signal lines 120 configured for transmitting the scan signals in FIG. 4 and FIG. 5. FIG. 4 and FIG. 5 are partial enlarged views of other types of the pixel array in the area B of FIG. 2A. With reference to FIG. 4 and FIG. 5, the pixel arrays 300 and 400 of the present embodiment in FIG. 4 and FIG. 5 is substantially the same as the pixel arrays 100 and 200 of FIG. 2A and FIG. 3A, and the same components are represented by the same reference numbers. Thus, corresponding contents thereof are not reiterated hereinafter.

The primary difference between FIG. 2A and FIG. 3A lies in that the first signal lines 110 of FIG. 4 and FIG. 5 are electrically connected to the sources SE for transmitting the data signals, and the second signal lines 120 are electrically connected to the gates GE for transmitting the scan signals. In addition, the primary difference between FIG. 4 and FIG. 5 lies in that active devices 130b adopt the structure of the bottom gate thin film transistor, while active devices 130c adopt the structure of top gate thin film transistor, wherein cross-sectional views of the active devices 130b, the first intersections X1 and the second intersections X2 of FIG. 4 may be referred to the content illustrated in FIG. 2C. Moreover, cross-sectional views of the active devices 130c, the first intersections X1 and the second intersections X2 of FIG. 5 may be referred to the content illustrated in FIG. 3B. Thus, reiteration is not repeated herein.

In conclusion, the pixel array of the invention is provided with the protrusions at the second intersections, such that patterns detected at the first intersections and the second intersections are substantially the same, so as to minimize interferences caused by dummy defects generated by patterns of the bridge points.

Although the invention has been disclosed with reference to the aforesaid embodiments, they are not intended to limit the invention. It will be apparent to those skilled in the art that various modifications and variations can be made to the structure of the disclosed embodiments without departing from the scope or spirit of the invention. In view of the foregoing, it is intended that the disclosure cover modifications and variations of the specification provided they fall within the scope of the following claims and their equivalents.

What is claimed is:

1. A pixel array, comprising:
   a plurality of first signal lines;
   a plurality of second signal lines electrically insulated to the first signal lines and intersected with the first signal lines;
   a plurality of active devices electrically connected to one of the first signal lines and one of the second signal lines, respectively;
   a plurality of pixel electrodes electrically connected to the active devices;
   a plurality of selection lines electrically insulated to the second signal lines and intersected with the first signal lines so as to form a plurality of intersections, the intersections comprising a plurality of first intersections and a plurality of second intersections, the selection lines electrically connected to the first signal lines at the first intersections;
   a plurality of protrusions disposed between the selection lines and the first signal lines, and located at the second intersections; and
   an insulation layer at least located between the first signal lines and the selection lines, and the protrusions located between the insulation layer and the selection lines, wherein the insulation layer has a plurality of openings corresponding to the first intersections, the selection lines are in contact with the first signal lines through the openings, and wherein a profile of an orthogonal projection of each of the protrusions on the first signal line is identical to a profile of an orthogonal projection of each of the openings on the first signal line.

2. The pixel array as claimed in claim 1, wherein each of the active devices comprises a gate, a channel layer, a source and a drain, the channel layer and the gate located on upper and lower sides are opposite to each other and the insulating layer is disposed between the channel layer and the gate, the source and the drain are located at two opposite sides of the channel layer, respectively.

3. The pixel array as claimed in claim 2, wherein the protrusions and the channel layer of the active devices are located at the same layer.

4. The pixel array as claimed in claim 2, wherein each of the selection lines crosses multiple of the protrusions, and heights of the selection lines at the second intersections are higher than heights of the selection lines at other locations.

5. The pixel array as claimed in claim 2, wherein each of the first signal lines crosses multiple of the protrusions, and heights of the first signal lines at the second intersections are higher than heights of the first signal lines at other locations.

6. The pixel array as claimed in claim 1, wherein a material of the protrusions is different from a material of the insulation layer.

7. The pixel array as claimed in claim 1, wherein numbers of the protrusions are equal to numbers of the second intersections, and each of the protrusions is located at one of the second intersections.

8. The pixel array as claimed in claim 1, wherein the protrusions has the same shape and size.

9. The pixel array as claimed in claim 1, wherein each of the protrusions is an island-shaped protrusion.

10. The pixel array as claimed in claim 1, wherein the protrusions are not in direct contact with the first signal lines.

11. The pixel array as claimed in claim 1, wherein each of the selection lines is electrically connected with only one of the first signal lines.

* * * * *